United States Patent
Hovis et al.

(10) Patent No.: US 7,224,633 B1
(45) Date of Patent: May 29, 2007

(54) EFUSE SENSE CIRCUIT

(75) Inventors: William Paul Hovis, Rochester, MN (US); Alan James Leslie, Wappingers Falls, NY (US); Phil Paone, Rochester, MN (US); David W. Siljenberg, Byron, MN (US); Salvatore Nicholas Storino, Rochester, MN (US); Gregory John Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/297,311

(22) Filed: Dec. 8, 2005

(51) Int. Cl.
*G11C 17/18* (2006.01)

(52) U.S. Cl. .................... 365/225.7; 365/207

(58) Field of Classification Search ......... 365/225.7, 365/207, 189.09
See application file for complete search history.

(56) References Cited

U.S. PATENT DOCUMENTS

| | | | |
|---|---|---|---|
| 5,384,727 A * | 1/1995 | Moyal et al. | 365/96 |
| 6,368,902 B1 | 4/2002 | Kothandaraman et al. | |
| 6,624,499 B2 | 9/2003 | Kothandaraman et al. | |
| 6,995,601 B2 * | 2/2006 | Huang et al. | 327/525 |

OTHER PUBLICATIONS

Kyunam Lim, et al., "Bit Line Coupling Scheme and Electrical Fuse Circuit for Reliable Operation of High Density DRAM", Dig. Symp. VLSI Circuits, pp. 33-34, Jun. 2001.
Bruce Cowan, et al., "On-Chip Repair and an ATE Independent Fusing Methodology", ITC International Test Conference Proceedings, pp. 178-186, Oct. 2002.
Mohsen Alavi, et al., "A PROM Element Based on Salicide Agglormeration of Poly Fuses in a CMOS Logic Process", IEDM Tech. Dig., pp. 855-858, Dec. 1997.
C. Kothandaraman, et al., "Electrically Programmable Fuse (eFUSE) Using Electromigration in Silicides", IEEE Electron Device Lett., vol. 23, No. 9, pp. 523-525.

\* cited by examiner

*Primary Examiner*—Vu A. Le
(74) *Attorney, Agent, or Firm*—Robert R. Williams

(57) ABSTRACT

An eFuse reference cell on a chip provides a reference voltage that is greater than a maximum voltage produced by an eFuse cell having an unblown eFuse on the chip but less than a minimum voltage produced by an eFuse cell having a blown eFuse on the chip. A reference current flows through a resistor and an unblown eFuse in the eFuse reference cell, producing the reference voltage. The reference voltage is used to create a mirrored copy of the reference current in the eFuse cell. The mirrored copy of the reference current flows through an eFuse in the eFuse cell. A comparator receives the reference voltage and the voltage produced by the eFuse cell. The comparator produces an output logic level responsive to the voltage produced by the eFuse cell compared to the reference voltage.

17 Claims, 8 Drawing Sheets

Minimum Value of R1 (R1a)

Maximum Value of R1 (R1b)

Fig. 4C                    Fig. 4D

Typical Value of R1 (R1c)

Tracking

EFUSE SENSE CIRCUIT

BACKGROUND OF THE INVENTION

1. Field of the Invention

This invention relates generally to eFuses (electrically programmable fuses). More specifically, this invention relates to sensing whether an eFuse is blown or not blown.

2. Description of the Related Art

Electronic systems often require function to be enabled, disabled, or modified after semiconductor chips used in the electronic systems have been manufactured. For example, a common chip may be designed to serve multiple applications, the chip originally having circuitry to support all of the multiple applications. After manufacture of the chip, eFuses can be blown to personalize the chip for a particular specific application. For a second example, sometimes chips are manufactured imperfectly and portions of the chip are unusable. A computer processor chip may be designed to have a 128 KB (kilobyte) cache, but testing may determine that only 64 KB of the 128 KB is functional. If the remainder of the chip is functional, the chip may still be used, but information must be stored on the chip so that no attempt to use the nonfunctional 64 KB portion of the 128 KB cache is performed.

On modern semiconductor chips eFuses are often used to store such information. An eFuse is electronically programmable, and may be programmed by blowing the eFuse after a chip is manufactured. In many applications, the eFuse is blown even after an electronic system utilizing the chip has been in operation for some time.

An eFuse comprises a silicided polysilicon conductor. Silicide has been widely used in semiconductor products to reduce resistance of a polysilicon conductor, for example polysilicon gates used in Field Effect Transistors (FETs), or a doped silicon region, such as a source or drain of a FET. An eFuse is blown by directing a current of sufficient magnitude and duration through the eFuse to remove by melting or electromigration at least a portion of the silicide between a first end and a second end of the eFuse. Removal of at least a portion of the silicide changes an electrical resistance between the first end and the second end of the eFuse. Descriptions of eFuses can be found in U.S. Pat. No. 6,368,902, "Enhanced eFuses by the local degradation of the fuse link", by Chandrasekharan Kothandaraman, et al, and U.S. Pat. No. 6,624,499, "System for programming fuse structure by electromigration of silicide enhanced by creating temperature gradient", by Chandrasekharan Kothandaraman, et al.

Polysilicon has a relatively wide tolerance on resistance. Silicided polysilicon, while having a lower resistance, also has a relatively wide tolerance on resistance. Furthermore, there is a significant range in exactly how much silicide is removed from polysilicon on an eFuse when the eFuse is blown. Beyond normal process variations and variations on how much silicide is removed, resistance of silicided polysilicon and unsilicided polysilicon varies with temperature. These variations have, in previous electronic systems having eFuses, made the task of sensing whether an eFuse is blown or unblown difficult and problematic.

Therefore, there is a need for a method and apparatus that provides for reliable, simple, and fast sensing of an eFuse to determine if an eFuse is blown or unblown.

SUMMARY OF THE INVENTION

The present invention includes eFuse system embodiments having methods and apparatus to reliably, simply, and quickly determine if an eFuse is blown or unblown.

The eFuse system comprises a reference cell that further includes a reference resistance comprising a series connected resistor and an unblown first eFuse. The reference cell includes a first circuitry that, when connected to suitable voltage supplies, produces a reference current that flows through the reference resistance, producing a reference voltage.

The eFuse system further comprises an eFuse cell that further includes a second eFuse. The second eFuse is configured to have a first resistance if blown and a second resistance if unblown. The first resistance is greater than the reference resistance. The second resistance is less than the reference resistance. The eFuse cell is coupled to the reference voltage. A second circuitry in the eFuse cell uses the reference voltage, when the second circuitry is connected to the suitable voltage supplies, to produce a mirrored copy of the reference current. The mirrored reference current flows through the eFuse in the eFuse cell, producing an eFuse cell voltage output.

The eFuse system further comprises a comparator that, when the comparator is powered with a comparator voltage supply, is configured to compare the reference voltage and the eFuse cell voltage output. If the reference voltage is greater than the eFuse cell voltage output, the comparator outputs a first logical value. If the reference voltage is less than the eFuse cell voltage output, the comparator outputs a second logical value different than the first logical value, the first and second logical values indicative of whether the eFuse in the eFuse cell is blown or unblown.

The eFuse system can have a plurality of eFuse cells that are independently programmed to have a blown or unblown eFuse. The eFuse or eFuses can be programmed at the manufacturing site, or, in some applications, are programmed after an electronic system containing the eFuse system has been shipped to a customer. In some applications, the eFuse or eFuses are programmed after the electronic system containing the eFuse system has been in operation by the customer for some time.

The eFuse system reliably senses whether a particular eFuse is blown or unblown since the mirrored current is equal to the reference current (within tracking tolerances on the same chip). Therefore a first voltage drop across the unblown eFuse in the reference circuit is the same as a second voltage drop across an unblown eFuse in an eFuse cell (again, within tracking tolerances on the same chip).

BRIEF DESCRIPTION OF THE DRAWINGS

FIGS. 4A–4F illustrate resistances and tolerances of blown and unblown eFuses and how to correctly determine a resistance of the resistor in the reference cell.

DETAILED DESCRIPTION OF THE PREFERRED EMBODIMENTS

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

The present invention provides a method and apparatus to reliably, simply, and quickly determine if an eFuse in an eFuse system is blown or unblown.

A reference cell comprises a first circuitry configured to produce, when the first circuitry is connected to suitable voltage supplies, a reference current that passes through a reference resistance including a series connected unblown eFuse and resistor. The reference resistance is less than a resistance value of a blown eFuse on the same chip. The reference resistance is greater than a resistance of an unblown eFuse on the same chip. The reference cell produces a reference voltage determined by the reference current passing through the reference resistance.

The reference voltage is coupled to an eFuse cell. The reference voltage is used in the eFuse cell by a second circuitry configured, when the second circuitry is connected to the suitable voltage supplies, to create a mirror of the reference current in the eFuse cell. The mirrored reference current is passed through an eFuse in the eFuse cell, producing an eFuse cell voltage output. The reference voltage is greater than an eFuse cell voltage output if the eFuse in the eFuse cell is unblown. The reference voltage is less than an eFuse cell voltage output if the eFuse in the eFuse cell is blown.

The eFuse cell voltage is compared with the reference voltage by a comparator, the comparator operable when supplied by a suitable comparator supply voltage. An output of the comparator is a logical value responsive to whether an eFuse cell voltage output is greater than or less than the reference voltage.

Figure 1:
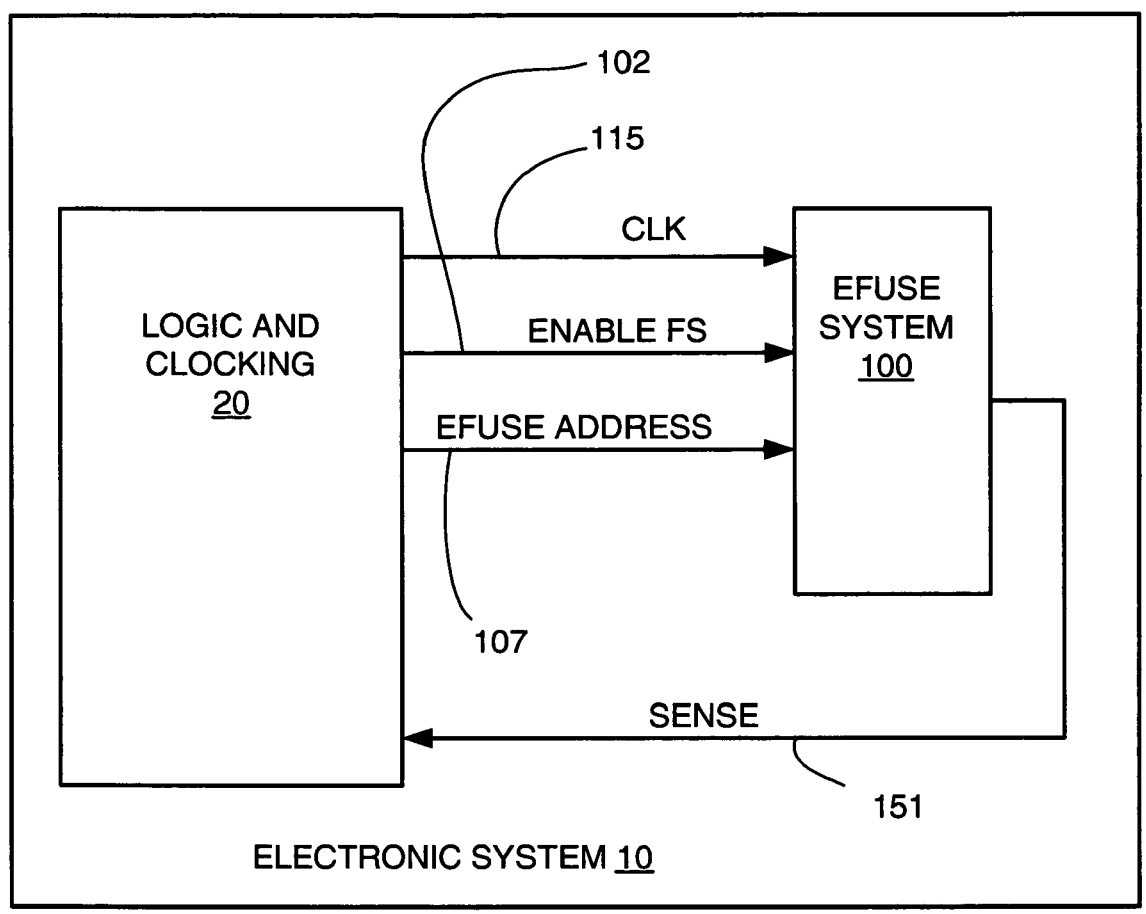
FIG. 1 is a block diagram of an electronic system including an eFuse system.

Referring now to FIG. 1, an electronic system 10 is shown. Electronic system 10 can be, for examples intended to explain but not limit, a computer processor, an ASIC (application specific integrated circuit) chip, a PDA (personal digital assistant), or an electronic game system. Electronic system 10 comprises logic and clocking 20. Logic and clocking 20, in various electronic system 10 implementations further includes (not shown) an ALU (arithmetic and logic unit), registers, SRAMs (static random access memory), DRAMs (dynamic random access memory), timers, control logic, and the like. Logic and clocking 20 further includes clocking circuitry that, in embodiments, includes phase locked loops, delay locked loops, and oscillators. As stated above, many electronic systems 10 require eFuses to provide nonvolatile personalization after chip manufacture. eFuse system 100 provides such nonvolatile personalization by providing eFuses that can be blown under control of logic and clocking 20. Logic and clocking 20 provides an eFuse address 107 to eFuse system 100 which, as will be explained in detail later, is used to address an eFuse that is to be blown, or, in an embodiment, is also used to determine which eFuse to sense. Logic and clocking 20 provides an ENABLE FS 102 signal that is used to place eFuse system 100 into a mode where eFuses can be blown, or, alternatively, where eFuses can be sensed. Logic and clocking 20 also sends a clock 115 to eFuse system 100. Clock 115 is used during programming (blowing) of eFuses in eFuse system 100. eFuse system 100 sends information regarding whether one or more eFuses are blown back to logic and clocking 20 on SENSE 151.

Figure 2A:
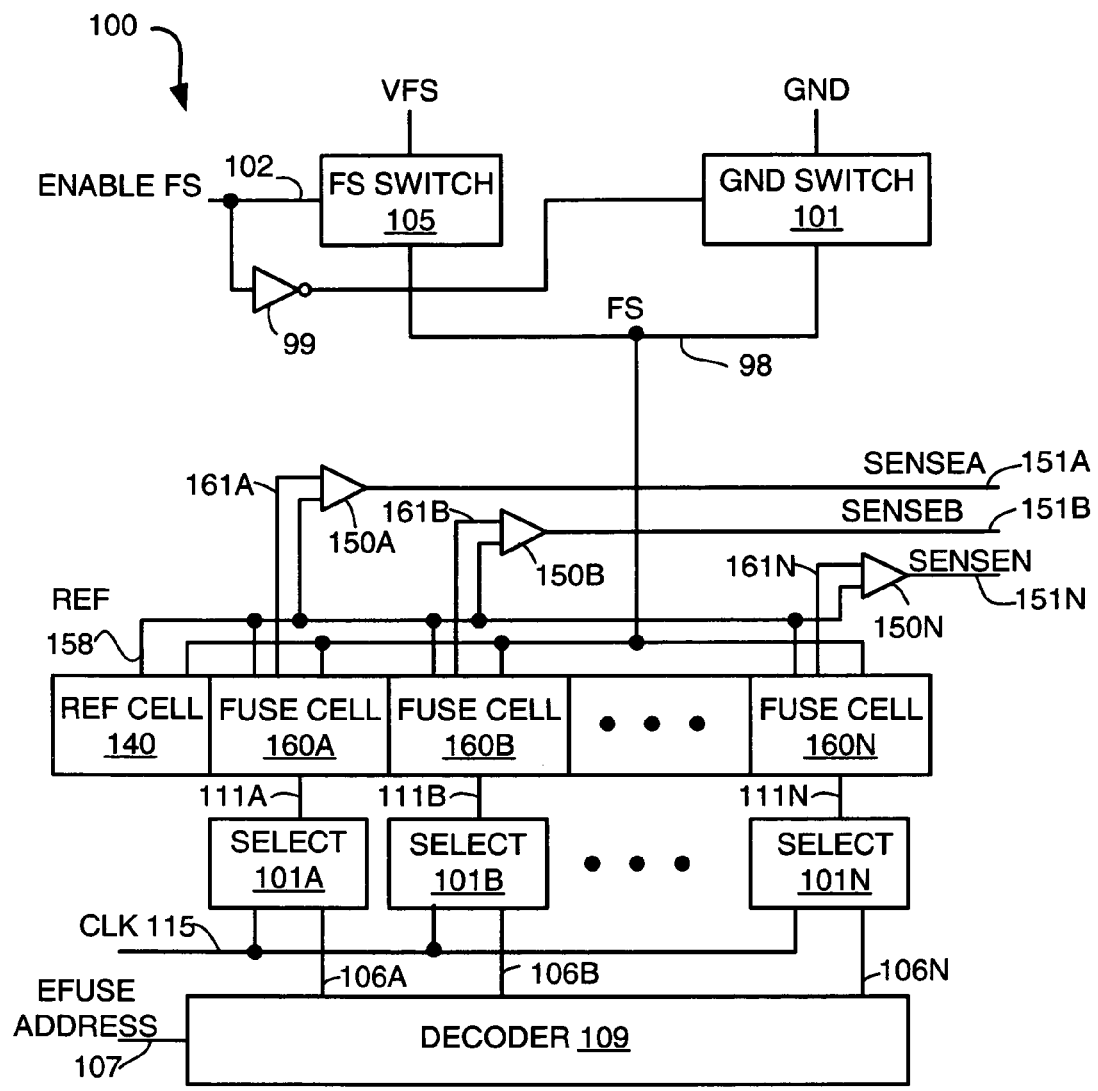
FIG. 2A is a block diagram of an eFuse system.

Referring now to FIG. 2A, eFuse system 100 is shown in block diagram form. A reference cell 140 provides a reference voltage 158 that is distributed to one or more eFuse cells 160, shown as eFuse cells 160A–160N. Details of reference cell 140 and eFuse cell 160 are shown later.

A voltage supply VFS supplies a voltage, (e.g., 3.5 volts, a relatively high voltage, for current semiconductor technologies) that is connected to node FS 98 when enable fuse source (ENABLE FS) 102 is active. The voltage supplied by VFS is suitable for blowing an eFuse in an eFuse cell 160. It will be understood that, as eFuse technology advances, that VFS, in the future, may not be of significantly higher voltage than VDD. VFS, in fact, may actually be VDD in embodiments where VDD is of sufficient voltage to blow an eFuse. FS switch 105 must have a low enough electrical resistance to accommodate blowing an eFuse in an eFuse cell 160. In some embodiments, FS switch 105 is physically on the same chip as the remainder of eFuse system 100. In other embodiments, FS switch 105 is physically implemented off the chip and is mounted, e.g., on a card upon which the chip is mounted, with node FS 98 being coupled onto the chip. Inverter 99 inverts ENABLE FS 102 to control GND switch 101 to couple FS 98 to ground when ENABLE FS 102 is not controlling FS switch 105 to couple FS 98 to VFS.

When ENABLE FS 102 is inactive, the VFS voltage supplied via FS Switch 105 to node FS 98 is disconnected and node FS 98 is connected to ground by GND Switch 101. GND switch 101 must be designed to withstand the voltage supplied from VFS through FS switch 105, in particular, if VFS is a higher voltage than VDD. For example, use of stacked NFETs with suitable voltages coupled to gates of the NFETs is a known way to provide switch capability while avoiding stress on any NFET. In some embodiments, GND switch 101 is physically on the same chip as the remainder of eFuse system 100. In other embodiments, GND switch 101 is physically implemented off the chip and is mounted, e.g., on a card upon which the chip is mounted, with node FS 98 being coupled onto the chip. In an application, both FS switch 105 and GND switch 101 are physically implemented off the chip that the remainder of eFuse system 100 and FS 98 is coupled onto the chip.

Each eFuse cell 160 produces an eFuse cell voltage output 161, shown in FIG. 2A as 161A–161N from eFuse cells 160A–160N, respectively. In FIG. 2A, comparators 150A–150N each compare an eFuse cell voltage output 161 with the reference voltage and produces a logical "1" or a logical "0" responsive to whether the eFuse cell voltage output 161 input to a particular comparator 150 is greater than or less than the reference voltage 158. For example, comparator 150A compares eFuse cell voltage output 161A with reference voltage 158 and comparator 150A outputs a logical "1" if eFuse cell voltage output 161A is greater than reference voltage 158, signifying that the eFuse in eFuse cell 160A has been blown. If the eFuse in eFuse cell 160A has not been blown, eFuse cell voltage output 161A is less than reference voltage 158, and comparator 150A outputs a logical "0". Comparators 150A–150N are powered by a suitable comparator voltage supply. Typically, a comparator 150 on a chip is powered by VDD as a suitable comparator voltage supply, although other voltage supplies are contemplated. A comparator 150 has to have an operable input voltage range that accommodates reference voltage 158 and an eFuse cell voltage output.

Decoder 109 receives an eFuse address 107 and, responsive to a value driven on eFuse address 107, activates a select signal 106, shown as 106A–106N coupled to select circuits 101A–101N, respectively. Select circuits 101A–101N also receive a clock 115 that is activated when an eFuse cell 160 is to be programmed. For example, if decoder 109 receives an eFuse address 107 that is the address for eFuse cell 160A, then select signal 106A is activated to a "1". When clock 115 is activated ("1"), a signal 111A is driven active to eFuse cell 160A. Signals 111B–111N are inactive when signal 111A is selected. At the same time, ENABLE FS 102 is activated, causing FS switch 105 to couple voltage VFS to FS 98, and to prevent GND switch 101 from coupling FS 98 to ground. An eFuse in eFuse cell 160A is blown when signal 111A is active at the same time that node FS 98 is coupled to VFS by FS switch 105.

Figure 2B:
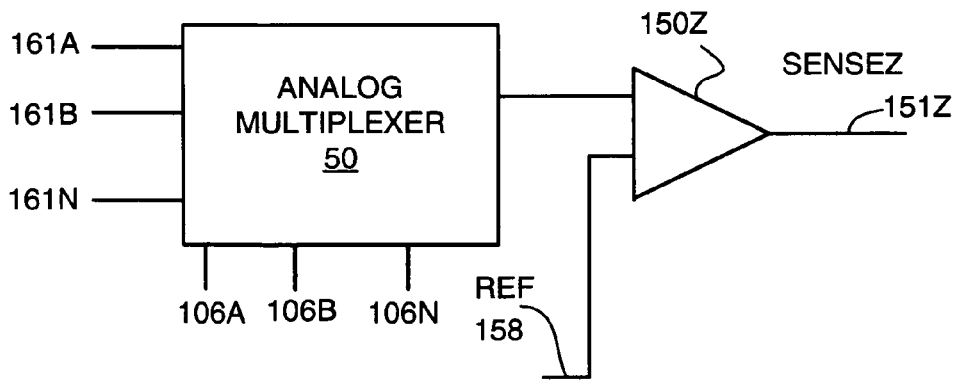
FIG. 2B is a block diagram showing an alternative embodiment of a portion of the eFuse system of FIG. 2A.

FIG. 2B shows an alternative embodiment for sensing eFuse cell voltage outputs 161 versus reference voltage 158. eFuse cell voltage outputs 160A–160N are connected to data inputs of an analog multiplexer 50. Select signals 106A–106N are coupled to control inputs of analog multiplexer 50. Responsive to an active signal on a select signal 106A–106N, a corresponding eFuse voltage output 161A–161N is routed to a first input of comparator 150Z. Reference voltage 158 is coupled to a second input of comparator 150Z. SENSEZ 151Z is output from comparator 150Z, having a first value if the selected eFuse cell voltage output 161 is greater than reference voltage 158 and a second value if the selected eFuse cell voltage output 161 is less than reference voltage 158.

Figure 3A:
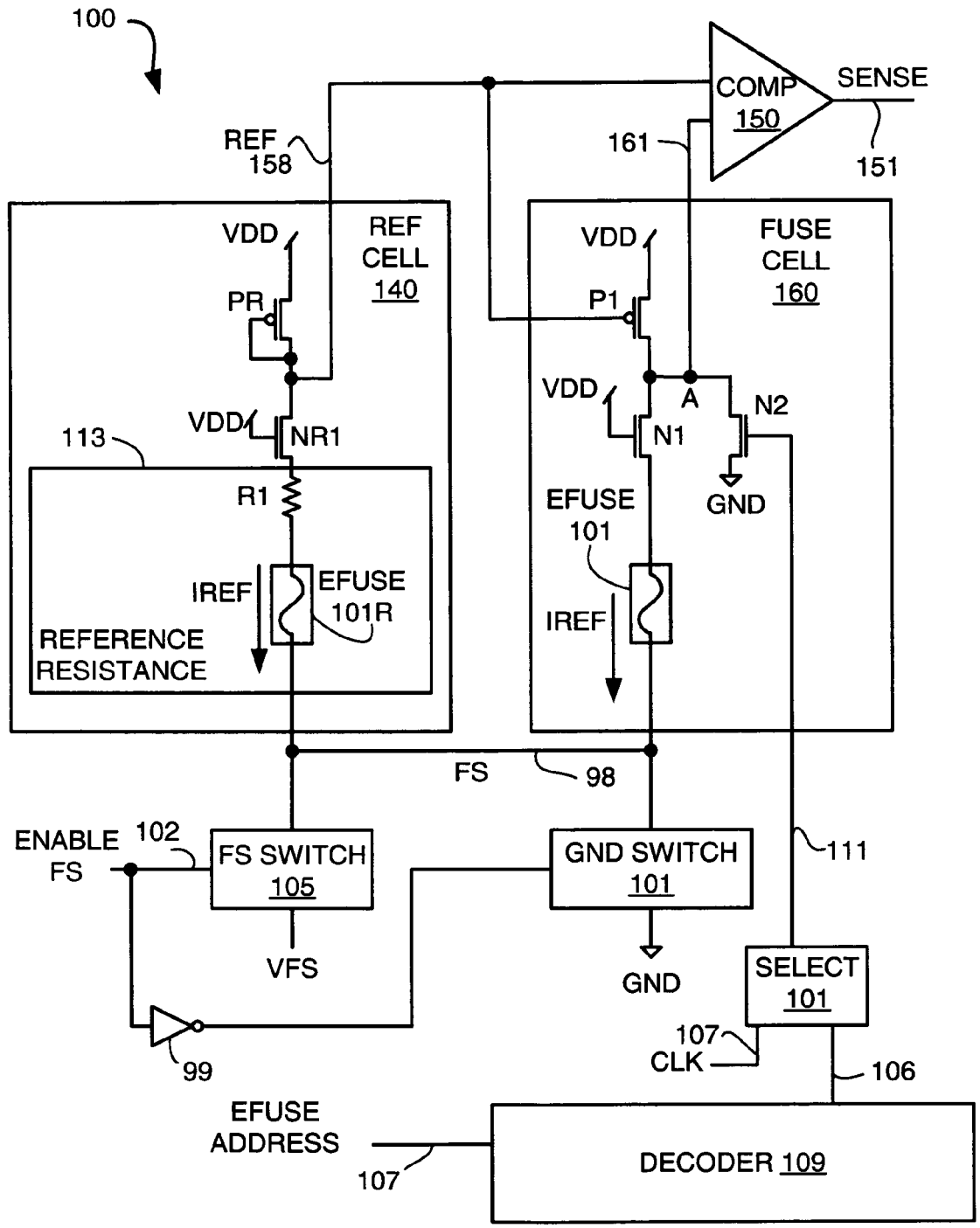
FIG. 3A shows a schematic drawing of a reference cell and an eFuse cell of the eFuse system.

FIG. 3A shows eFuse system 100 with more detail with regards to reference cell 140 and an exemplary eFuse cell 160. As shown in FIGS. 2A and 2B, eFuse cell 160 is instantiated as eFuse cells 160A–160N with the appended letters identifying the individual instantiations of particular eFuse cells. Similarly, selection signals (signal 111 is instantiated as signals 111A–111N), and eFuse voltage output 161 is instantiated as eFuse voltage outputs 161A–161N) as shown in FIGS. 2A, 2B.

During programming (blowing) of an eFuse in eFuse cell 160, as described above, node FS 98 is coupled to VFS under control of ENABLE FS 102. Signal 111 is activated to a "1". Current sufficient to blow eFuse 101 flows from voltage supply VFS through FS switch 105, eFuse 101, NFET (N channel Field Effect Transistor) N1 (in embodiments having N1), and NFET N2 to ground. PFET (P channel Field Effect Transistor) P1 is off or substantially off, that is, most current flowing through eFuse 101 flows through NFETs N1 and N2. P1 can be held completely off using known circuit techniques (not shown), such as coupling a gate of P1 to node A in FIG. 3A, when ENABLE FS 102 is "1". NFET N1 clamps voltage on node A to an FET threshold below VDD, protecting PFET P1 and comparator 150 from being stressed when node FS 98 is coupled to VFS.

Figure 3B:
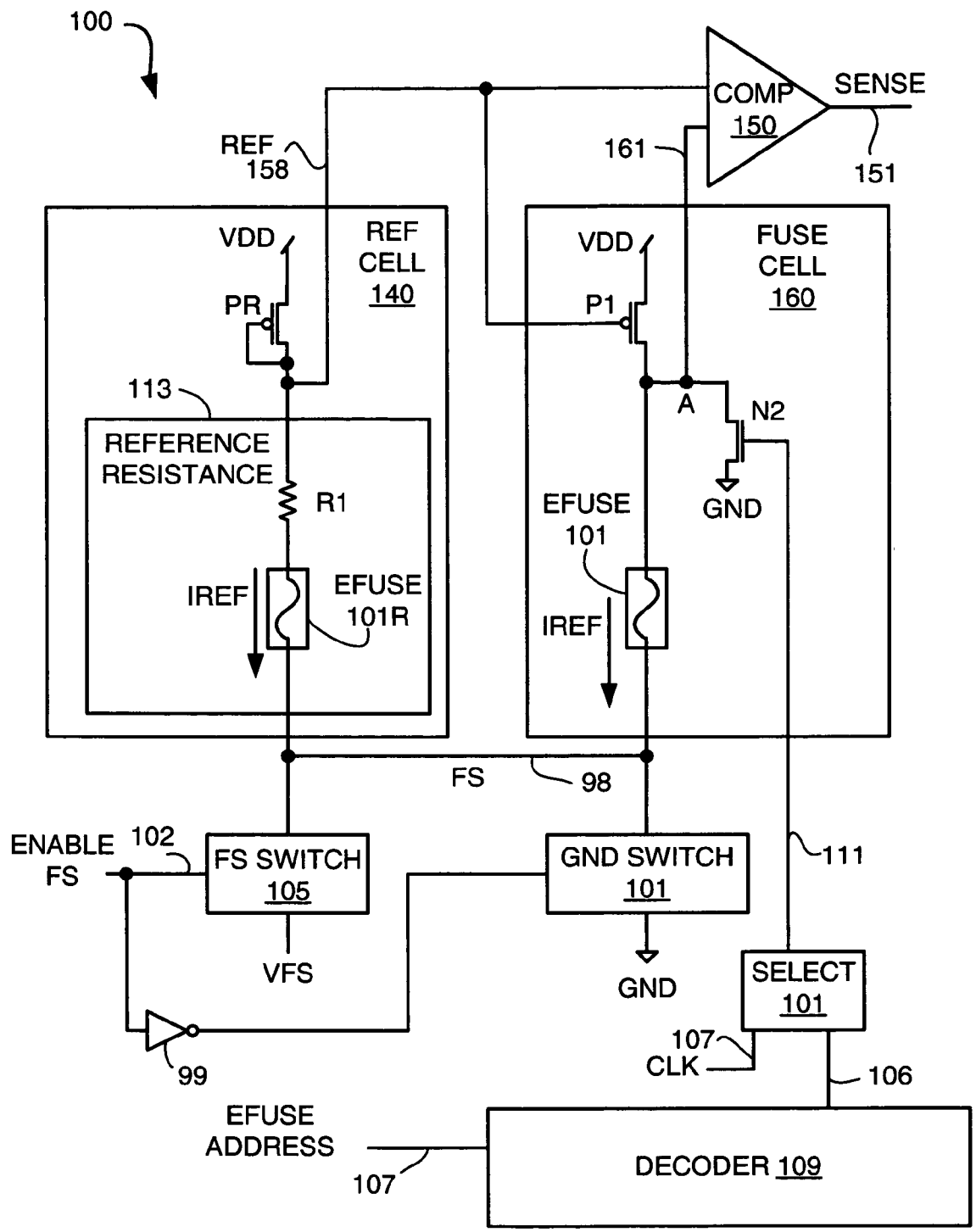
FIG. 3B shows an alternate embodiment of the reference cell and the eFuse cell of FIG. 3A.

In present eFuse technologies, VFS is relatively high compared to VDD, and N1 and N1R are required to protect P1 and PR and circuitry in comparator 150. In an embodiment in which voltage supply VFS is not high enough to stress or damage FETs in reference cell 140 or fuse cell 160, NFET N1 (and NFET NR1, in reference cell 140) is not required, and eFuse 101 can be directly coupled to the drain of PFET P1 (and reference resistance 113 can be directly coupled to the drain of PR in reference cell 140) as shown in FIG. 3B.

Magnitude and duration of current needed to blow an eFuse is determined by a designer for a particular chip technology.

Reference cell 140 in FIG. 3A comprises a PFET PR, an NFET NR1, and a reference resistance 113, the reference resistance 113 further comprising a resistor R1, and an eFuse 101R connected in series with resistor R1. eFuse 101R is never blown. Therefore, no select line 111 is coupled to reference cell 140, and a counterpart to NFET N2 is not needed in reference cell 140. NFET NR1, similar to NFET N1 in eFuse cell 160, protects PR from being stressed in embodiments where node FS 98 is coupled to a relatively high voltage VFS, as described above. R1 is made from any suitable structure on the chip that can make a resistor. For example, in various embodiments, R1 is constructed from a metal conductor on the chip; a doped silicon structure on the chip, a suitably sized FET on the chip, or even another eFuse. In an embodiment in which voltage supply VFS is not high enough to stress or damage FETs in reference cell 140 or fuse cell 160, NR1 is not required, and a first node of resistor R1 can be directly coupled to the drain of PR. In present eFuse technologies, VFS is relatively high, and the first node of reference resistance 113 is coupled through NFET NR1 to the drain of PFET PR in order to protect PFET PR and circuitry in comparator 150.

During sensing, ENABLE FS is "0", and node FS 98 is connected to ground through GND switch 101 and disconnected from VFS via FS switch 105. PR is "diode connected" (i.e., a gate of PR is connected to a drain of PR), and produces a current, IREF, which flows through NR1, R1, and eFuse 101R. NR1 (and its counterpart N1) are sized to be of much lower resistance than R1 and eFuse 101R; for example, NR1 and N1 are designed such that IREF causes voltage drop (drain to source) across NR1 and N1 that are less than 10% of reference resistance 113 and eFuse 101, respectively. NR1 and N1 are identically sized, so that drain-source voltage drops across NR1 and N1 are the same if drain-source current is the same. NR1 and N1 are in the embodiment described only to protect circuitry against high voltages. Drain-source voltages for NR1 and N1 are small, since N1 must be designed with a large enough width/length ratio to accommodate current required to blow an eFuse in eFuse cell 160. Reference currents are much smaller than fuse blow currents. Drain-source voltage drops for NR1 and N1 do not determine differences between the reference voltage and an eFuse cell voltage output. Therefore, the small drain-source voltage drops in NR1 and N1 are not considered functional voltages in the relative magnitudes of the reference voltage and the eFuse cell voltage output. It will be understood that the small drain-source voltages of NR1 and N1 have to be considered when contemplating common mode ranges of a comparator 150.

Reference voltage 158 is coupled to a gate of PFET P1 in eFuse cell 160 as shown in FIG. 3A, PFET P1 mirroring the current, IREF, in eFuse cell 160. During sensing (ENABLE FS="0"), signal 111 is "0" and NFET N2 is off. IREF flows through P1, N1 and eFuse 101. N1 and NR1 are designed to have the same drain-source voltage drop for a given IREF current. That is, N1 and NR1 are designed to have the same width and length. If eFuse 101 is unblown, a voltage across eFuse 101 resultant from the mirrored IREF current will be the same as a voltage across eFuse 101R (not considering tolerance) resultant from the IREF current in reference cell 140 since both eFuse 101 and eFuse 101R are unblown. If eFuse 101 is blown, electrical resistance of eFuse 101 increases significantly, and the mirrored IREF current of eFuse cell 160 will have a larger voltage drop across the blown eFuse 101 than the voltage drop across the unblown eFuse 101.

Resistor R1 in reference cell 140 is selected such that a voltage drop across reference resistance 113 is greater than the voltage drop across an unblown eFuse 101 in eFuse cell 160 on the same chip, including tolerances. Also, resistor R1 is selected such that the voltage drop across reference resistance 113 is less than a voltage drop across a blown eFuse 101 in eFuse cell 160 on the same chip, including tolerances.

In FIG. 3A, reference voltage 158 and eFuse cell voltage output 161 (node "A", as shown in eFuse cell 160) are taken from the nodes comprising drains of PR and NR1 (for reference voltage 158) and the drains of PFET P1 and NFET N1 (for eFuse voltage output 161). Drain-source voltage drops across NFETs NR1 and N1 during sense (i.e., ENABLE FS 102="0") are small, as described above. Since NR1 and N1 are identically designed NFETs, and carry the same current (IREF and the mirrored IREF), the drain-source voltage drops across NR1 and N1 will be equal (ignoring small on chip tracking differences).

In an alternative embodiment shown in FIG. 3B, NR1 and N1 are not implemented. The alternative embodiment shown in FIG. 3B can be used if VFS is not a high enough voltage to cause undue stress or damage to PR, P1, or comparator 150. Reference voltage 158 and eFuse cell output voltage 161 are taken, respectively, from the drains of PR and P1. Reference resistance 113 is directly connected to the drain of PR, instead of being indirectly coupled to the drain of P1 through NR1. eFuse 101 of eFuse cell 160 is directly connected to the drain of P1, instead of being indirectly coupled to the drain of P1 through N1.

It will be understood that, in reference resistance 113, resistor R1 and eFuse 101R are series connected, and that the placement of R1 and eFuse 101R in reference resistance 113 can be reversed.

FIGS. 4A–4F illustrate how a designer chooses a value for resistor R1 in reference resistance 113 of reference cell 140, shown schematically in FIG. 3A and FIG. 3B. It will be recalled that a resistance range in an unblown eFuse has a significant tolerance.

Figure 4A:
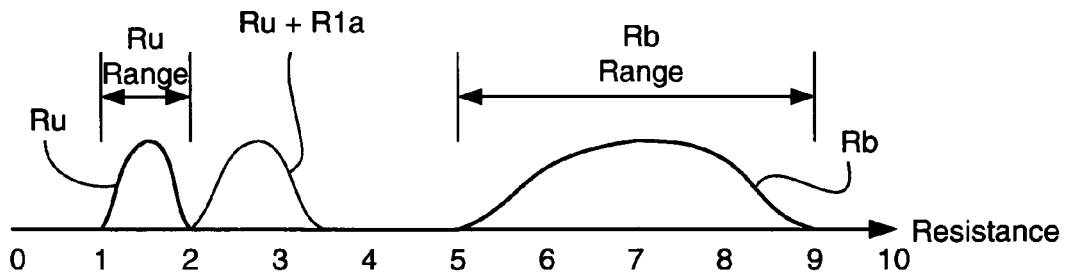
Figure 4B:
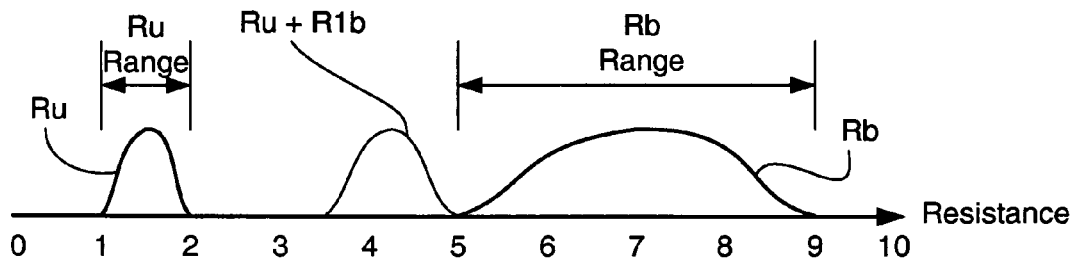
Figure 4B:
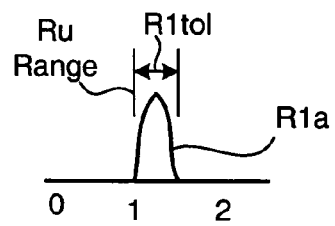
Figure 4B:
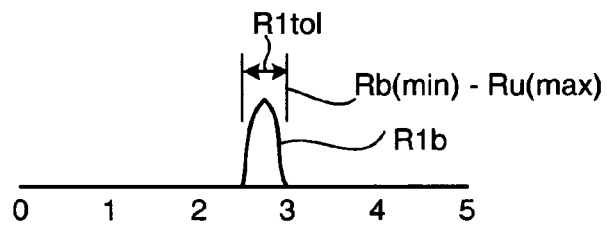
Figure 4E:
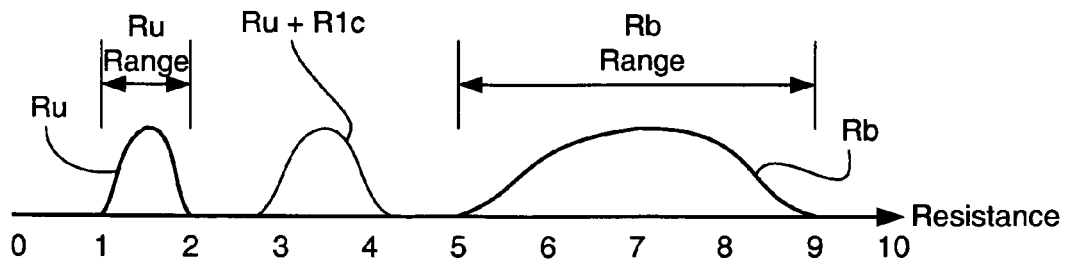

In FIGS. 4A, 4B, and 4E, Ru is a resistance value of an unblown eFuse. Ru range is the range of resistance that a particular unblown eFuse might have, including tolerances. Ru range extends from a minimum resistance value that a particular unblown eFuse could have to a maximum resistance value that the particular unblown eFuse could have. Similarly, Rb is a resistance of a blown eFuse, and Rb range extends from a minimum resistance value that a particular blown eFuse might have to a maximum resistance value that the particular blown eFuse might have.

R1a, referenced in FIG. 4A and FIG. 4C is an R1 resistor having a smallest value for R1 that is certain to allow comparator 150 to correctly distinguish an unblown eFuse. FIG. 4C illustrates a range of resistance, including tolerances, which R1a can have, including process and temperature tolerances. In the example of FIG. 4C, R1a is nominally 1.25 resistance units. For exemplary purposes, it will be assumed that resistance units are kilohms (KΩ), so R1a is nominally 1.25 KΩ. R1a must be greater than a minimum value, including tolerances, of 1.0 KΩ, and a maximum value of 1.5 KΩ. The minimum value of R1a is determined by the width of Ru range, which is shown as 1 KΩ (i.e., 2-1 KΩ, as shown in FIG. 4A). Therefore, if unblown eFuse 101R has a value of 1.0 KΩ (minimum value of Ru), the 1 KΩ R1 placed in series with eFuse 101R ensures that the series combination is at least as large as the most resistive eFuse 101 (i.e., 2 KΩ) that could be found in any eFuse cell 160. R1a must be at least incrementally greater than 1.0 KΩ; otherwise if eFuse 101R were 1 KΩ (minimum eFuse value) and R1a were also 1 KΩ (minimum R1a value), an eFuse having a maximum 2 KΩ on the same chip would result in reference voltage 158 being the same as eFuse cell voltage output 161 for the eFuse cell 160 having the 2 KΩ resistance, and comparator 150 would not be able to distinguish whether the 2 KΩ were blown or unblown. The above set of assumptions is pessimistic because it assumes no tracking between unblown eFuses on the same chip for process or temperature. In practice, tracking between similar devices on a particular semiconductor chip exists. A designer can investigate tracking specifications for a particular chip technology to determine the minimum resistance value for R1. For example, if perfect tracking were assumed (that is, all unblown eFuses on a particular chip have exactly the same resistance value, R1 can be very small, having only to cause the series resistance of R1 and eFuse 101R enough be slightly above the resistance of an unblown eFuse 101, and to accommodate tracking and input mismatches of comparator 150.

Because tracking between similar devices exists, resistance of eFuse 101R in reference cell 140 will track (to some specified degree) with resistance of eFuse 101 in eFuse cell 160. A relatively high resistance value of eFuse 101R in reference cell 140 causes reference current in reference cell 140 to decrease. A relatively low resistance value of eFuse 101R in reference cell 140 causes reference current in reference cell 140 to increase. Reference voltage 158 is coupled to P1 of eFuse cell 160. P1 mirrors the reference current of reference cell 140, and therefore, reference voltage 158 is a determinant of eFuse voltage output 161. Existence of tracking between resistance of eFuse 101R and eFuse 101 provides for a robust and reliable sensing apparatus. It will be expected that tracking between eFuse 101R and an unblown eFuse 101 will be better than tracking between eFuse 101R and a blown eFuse 101, since eFuse 101R is unblown.

It will be further understood that statistical combinations of Ru and R1 are contemplated. For example, FIG. 4A shows a distribution width of Ru+R1a extending from a minimum resulting from summing minimum values for both Ru and R1a to a maximum resulting from summing maximum values for Ru and R1a. If, in a particular implementation, resistance of eFuses is statistically independent from resistance of the resistance element used to implement R1, many designers would combine the tolerances statistically, for example designing to a three-sigma distribution width of the series combination as the square root of the sum of the squares of the three-sigma distribution widths of Ru and R1.

FIG. 4B and FIG. 4D similarly illustrate how a designer determines a maximum resistance value, R1b, for resistor R1. That is, R1b must be selected such that reference resistance 113 is less than the resistance of a blown eFuse 101.

FIG. 4D shows R1b as having a maximum resistance value of 3 KΩ, derived from Rb having a minimum value of 5 KΩ (see FIG. 4B) and Ru having a maximum value of 2 KΩ. FIG. 4B shows resistance distributions of Ru, Ru+R1b, and Rb. The sum of Ru+R1b must be less than the least value of Rb. As with the discussion regarding R1a, this derivation of R1b is pessimistic.

While the above derivations of R1a and R1b illustrate how to determine minimum and maximum resistance value limits for resistor R1, a designer typically does not choose a component such as R1 that is at the maximum or minimum possible values. Instead, the designer will choose a safer design that would accommodate errors or subsequent changes in specification of the chip technology regarding eFuse resistance. For example, if a designer chose R1a as his or her choice for resistor R1, and the eFuse resistance range Ru became wider, the designer's choice of R1a might result in an incorrect reading of an eFuse 101 as a blown eFuse instead of an unblown eFuse. Advantageously, therefore, a designer chooses a value of R1 as depicted in FIG. 4E as R1c. R1c is a resistance of approximate 1.75 KΩ, centering the distribution of the series combination of R1c+Ru, as shown, between the resistance distributions of an unblown eFuse and a blown eFuse.

Figure 4F:
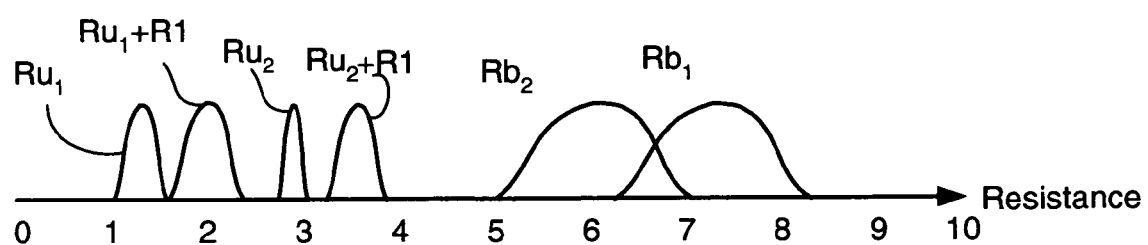

FIG. 4F shows, in more detail, how a designer includes on chip tracking considerations into choosing a value for resistor R1. Although the entire resistance distributions shown earlier are useful for explanation, and provide a workable value for R1, it suffices that, on a particular chip, the reference resistance 113 has a higher resistance value than any unblown eFuse on that particular chip, and that reference resistance 113 has a lower resistance value than any blown eFuse on that particular chip.

In FIG. 4F, $Ru_1$ shows a distribution of the resistance of an unblown eFuse on a first chip. $Ru_2$ shows a distribution of the resistance of an unblown eFuse on a second chip. Note that in the example of FIG. 4F that $Ru_1$ has a width of 0.5 KΩ, and that $Ru_2$ has a width of 0.3 KΩ. $Rb_1$ is a resistance distribution of a blown eFuse on the same chip that has the $Ru_1$ distribution; $Rb_2$ is a resistance distribution of a blown eFuse on the same chip that has the $Ru_2$ distribution. It is common that, in general, if a first unblown eFuse has a smaller resistance than a second unblown eFuse, when blown, the first eFuse will have a larger resistance than the second eFuse. This is because a larger current flows through the first unblown eFuse, which creates more heat, and therefore more silicide removal. Resistor R1 must be chosen such that the sum of R1 and Ru is greater than a maximum value of an unblown eFuse resistance on the same chip. R1 is shown as having a minimum resistance of 0.5 KΩ), which is the width of the $Ru_1$ distribution. The statistical sum of $Ru_1$+R1 is the distribution of reference resistance 113 (FIG. 3A) for a chip having eFuses with low resistance. $Ru_2$ is shown as having a larger resistance, but a smaller distribution. The value of R1 was chosen to be as wide as any unblown eFuse on chip distribution ($Ru_1$ in the example). The statistical sum of $Ru_2$+R1 is the distribution of reference resistance 113 for chips having eFuses with a relatively high unblown resistance. As with the discussion earlier that included less detail as to tracking, the designer must select a resistance value for R1 is chosen such that the reference resistance 113 has a higher resistance than any unblown eFuse on a particular chip, and reference resistance 113 must have a lower resistance than any unblown eFuse on the particular chip.

Figure 5:
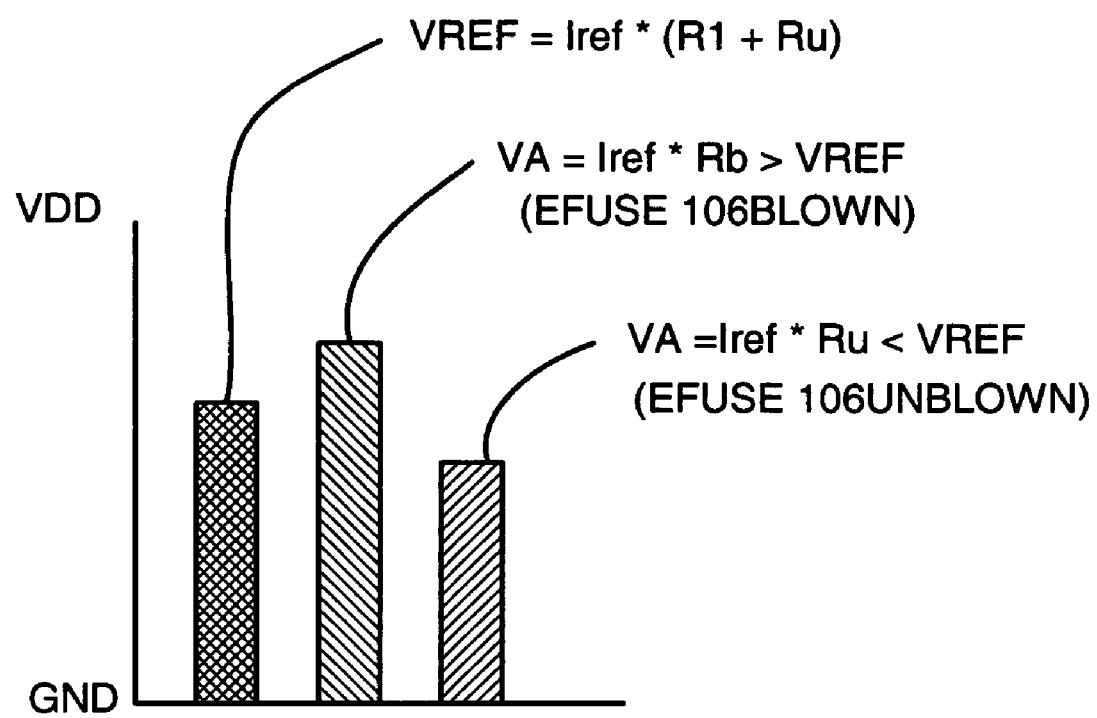
FIG. 5 shows an exemplary reference voltage and corresponding eFuse cell voltages for an eFuse cell having a blown eFuse and for an eFuse cell having an unblown eFuse.

Turning now to FIG. 5, exemplary voltage values are shown in bar chart form. The leftmost bar shows voltage value of reference voltage 158 (VREF), which is coupled to a first input of comparator 150. The magnitude of VREF is IREF*(R1+Ru), relative to node FS 98, which is coupled to ground by GND switch 101. For example, if GND switch 101 is implemented with series-connected on chip NFETs to withstand the relatively high VFS voltage used in some embodiments on node FS 98 during programming of eFuses, node FS 98 may be as much as several hundred millivolts above ground. If GND switch 101 is implemented as a relay off the chip, node FS 98 is very near ground when GND switch 101 is coupling node FS 98 to ground. Node FS 98 is commonly connected to reference resistance 113 and eFuses 101 in eFuse cells 160, so that if node FS 98 is not exactly ground, both reference voltage 158 and eFuse cell voltage outputs 161 will be equally raised above ground. The middle bar in FIG. 5 illustrates the value of an eFuse cell voltage output 161 of an eFuse cell 160 having a blown eFuse 101. The voltage on the middle bar in FIG. 5 is equal to IREF*Rb, which is larger than VREF (reference voltage 158) because, as explained above, Rb is larger than Ru+R1. Recall that IREF in eFuse cells 160 is a mirrored copy of IREF in reference cell 140. The rightmost bar in FIG. 5 illustrates the value of an eFuse cell voltage output 161 of an eFuse cell 160 having an unblown eFuse 101. The voltage on the rightmost bar in FIG. 5 is equal to IREF*Ru, which is less than VREF (reference voltage 158) because, as explained above, Ru is less than Ru+R1, and the same magnitude of current, IREF, flows through Ru in the unblown eFuse cell 160, and through Ru+R1 in reference cell 140.

Figure 6:
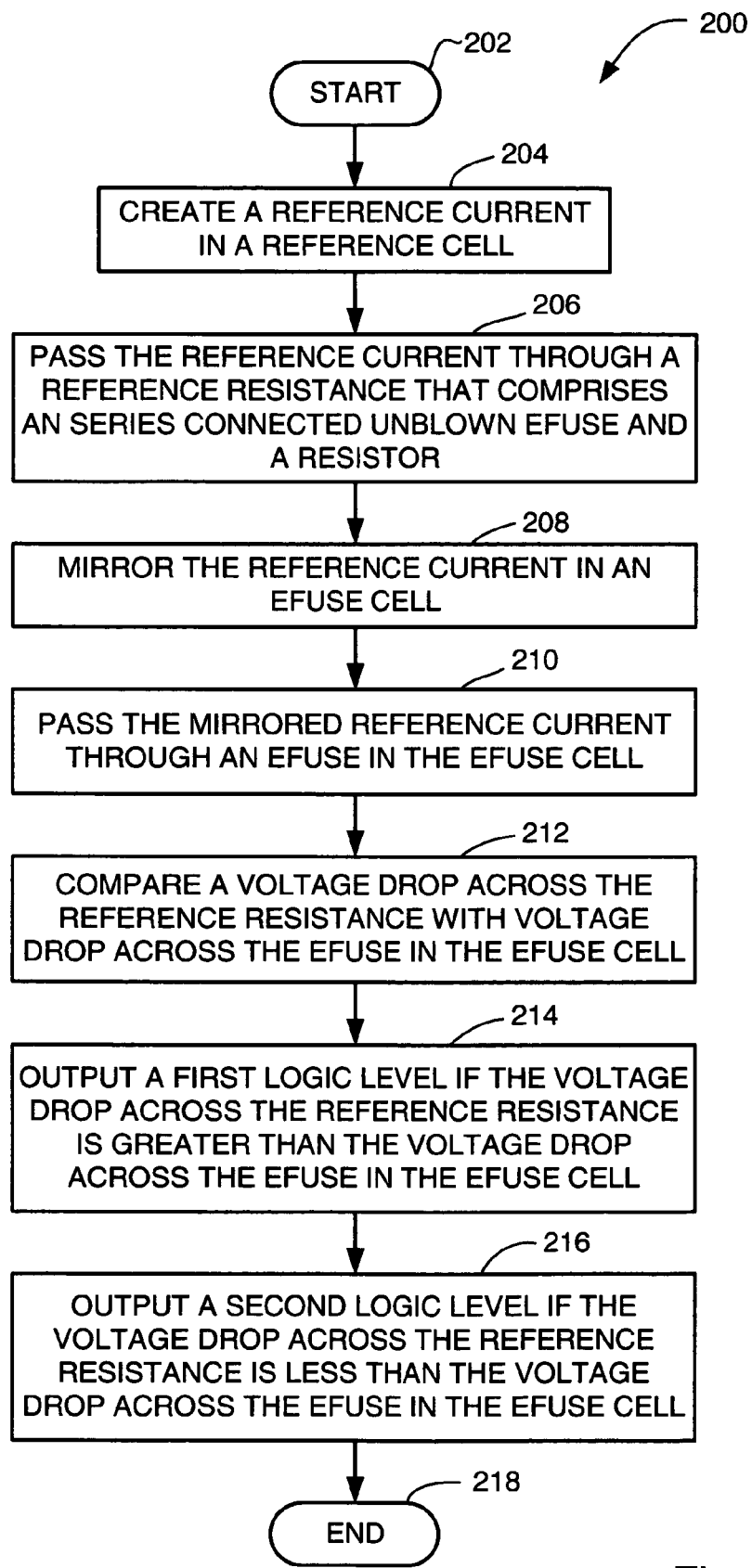
FIG. 6 is a flowchart of a method embodiment of the invention.

Embodiments of the invention can also be expressed as methods. FIG. 6 is a flowchart of method 200, an exemplary method embodiment of the invention.

Method 200 begins with step 202.

In step 204, a reference current is created in a reference cell. As explained earlier, a diode-connected FET coupled to a reference resistance that comprises a resistor and an unblown eFuse creates a suitable reference current. A resistance value is chosen for the resistor such that the resistance of the series combination of the unblown eFuse in the reference cell plus the resistor is greater than the resistance of an unblown eFuse, and such that the resistance of the series combination of the unblown eFuse in the reference cell plus the resistor is less than the resistance of a blown eFuse.

In step 206, the reference current passes through the reference resistance and establishes a voltage drop across the reference resistance, the voltage drop across the reference resistance being a reference voltage.

In step 208, the reference current created in step 204 is mirrored in an eFuse cell. As explained earlier, FETs are easily connected to mirror a current passing through a diode-connected FET by simply connecting a gate of a FET that produces the mirrored copy of the current to the gate and drain of the diode-connected FET, and connecting a source of the FET that produces the mirrored copy of the current to the same voltage supply connected to the source of the diode-connected FET.

In step 210, the mirrored reference current is passed through an eFuse in the eFuse cell, causing a voltage drop across the eFuse in the eFuse cell.

In step 212, the reference voltage is compared with the voltage drop across the eFuse in the eFuse cell. As described above, in embodiments such as shown in FIG. 2A, a separate comparator is used for each eFuse cell. In other embodiments such as shown in FIG. 2B, an analog multiplexer receives eFuse cell voltage outputs from more than one eFuse cell, and selects which eFuse cell voltage output, from the more than one eFuse cell, to pass to a first input of a comparator; the reference voltage being connected to a second input of the comparator.

In step 214, an output is driven to a first logic level if the voltage drop across the reference resistance is greater than the voltage drop across the eFuse in the eFuse cell. The first logic level indicates that the eFuse in the eFuse cell has not been blown.

In step 216, the output is driven to a second logic level if the voltage drop across the reference resistance is less than the voltage drop across the eFuse in the eFuse cell. The second logic level indicates that the eFuse in the eFuse cell has been blown.

The method ends at step 218.

What is claimed is:

1. An eFuse system comprising:
    a reference cell further comprising:
        a reference resistance further comprising a series connected resistor and an unblown first eFuse; and
        a first circuitry configured to produce a reference current, when suitable voltage supplies are coupled to the circuitry, that flows through the reference resistance producing a reference voltage between a first end of the reference resistance and a second end of the reference resistance;
    an eFuse cell comprising:
        a second eFuse having a first resistance greater than the reference resistance if the second eFuse is blown and a second resistance less than the reference resistance if the second eFuse is unblown; and
        a second circuitry configured to produce, when the suitable voltage supplies are coupled to the second circuitry, a mirrored copy of the reference current that flows through the second eFuse in the eFuse cell producing an eFuse cell voltage output between a first end of the second eFuse and a second end of the second eFuse;
    and
    a comparator having a first input coupled to the reference voltage and a second input coupled to the eFuse cell voltage output, the comparator, when supplied by a suitable comparator voltage supply, is configured to output a first logical level if the eFuse cell voltage output is greater than the reference voltage and a second logical level if the eFuse cell voltage output is less than the reference voltage.

2. The eFuse system of claim 1, the circuitry configured to produce a reference current further comprises:
    a diode-connected first FET having a source connected to a first voltage supply, a gate connected to the reference voltage and a drain connected to the reference voltage, the first voltage supply being a first of the suitable voltage supplies;
    wherein the reference current in the reference cell flows between the source and the drain of the first FET.

3. The eFuse system of claim 2, the eFuse cell further comprising:
    a second FET having a source connected to the first voltage supply, a gate connected to the reference voltage, and a drain coupled to the first end of the second eFuse, the drain further coupled to the eFuse cell voltage output, the second FET producing the mirrored copy of the reference current.

4. The eFuse system of claim 3, the reference cell further comprising a third FET coupled in series with the reference resistance.

5. The eFuse system of claim 4, the third FET having a drain connected to the drain of the first FET, a source connected to the first end of the reference resistance, and a gate connected to the first voltage supply.

6. The eFuse system of claim 4, the eFuse cell further comprising a fourth FET coupled in series with the second eFuse.

7. The eFuse system of claim 6, the fourth FET having a drain connected to the eFuse cell voltage output, a source connected to the first end of the second eFuse, and a gate connected to the first voltage supply, the fourth FET being identical to the third FET.

8. The eFuse system of claim 1, further comprising:
    a second eFuse cell having a second eFuse cell output voltage;
    an analog multiplexer having a first input coupled to the eFuse cell output voltage of claim 1, having a second input coupled to the second eFuse cell output voltage, and having a control input, the control input selecting whether the eFuse cell output voltage of claim 1 or the second eFuse cell output voltage is passed to an output of the analog multiplexer;
    wherein the output of the analog multiplexer is coupled to the second input of the comparator.

9. The eFuse system of claim 1, further comprising:
    a second voltage supply capable of supplying a sufficient current to blow an eFuse;
    a third voltage supply capable of sinking the sufficient current to blow the eFuse, and also capable of sinking the reference current and the mirrored reference current, the third voltage supply being a second of the suitable voltage supplies;
    a first switch capable of connecting and disconnecting the second voltage supply to the second end of the reference resistance and to the second end of the second eFuse; and
    a second switch capable of connecting and disconnecting the third voltage supply to the second end of the reference resistance and to the second end of the second eFuse.

10. The eFuse system of claim 9, the first switch connecting the second voltage supply to the second end of the reference resistance and to the second end of the second eFuse only during a first time period when the second eFuse is being programmed.

11. The eFuse system of claim 9, the second switch connecting the third voltage supply to the second end of the reference resistance and to the second end of the second eFuse only during a second time period when the second eFuse is being sensed.

12. An electronic system comprising an eFuse system that further comprises: a reference cell further comprising:
    a reference resistance further comprising a series connected resistor and an unblown first eFuse; and
    a reference current that flows through the reference resistance producing a reference voltage between a first end of the reference resistance and a second end of the reference resistance;
    an eFuse cell comprising:
        a second eFuse having a first resistance greater than the reference resistance if the second eFuse is blown and a second resistance less than the reference resistance if the second eFuse is unblown; and
        a mirrored copy of the reference current that flows through the second eFuse in the eFuse cell producing an eFuse cell voltage output between a first end of the second eFuse and a second end of the second eFuse;
    and
    a comparator having a first input coupled to the reference voltage and a second input coupled to the eFuse cell voltage output, the comparator outputs a first logical level if the eFuse cell voltage output is greater than the reference voltage and a second logical level if the eFuse cell voltage output is less than the reference voltage.

13. A method for sensing an eFuse in an eFuse cell to determine if the eFuse is blown or unblown comprising the steps of:

producing a first voltage value on an eFuse cell voltage output if the eFuse in the eFuse cell is unblown;

producing a second voltage value on the eFuse cell voltage output if the eFuse in the eFuse cell is blown, the second voltage value being greater than the first value; and passing a reference current through a reference resistance that includes a series connection of an unblown eFuse and a resistor to determine a reference voltage, the reference voltage being greater than the first voltage value and the reference voltage being less than the second voltage value.

14. The method of claim 13, the step of producing a first voltage value on an eFuse cell voltage output further including the steps of:

mirroring the reference current in the eFuse cell; and passing the mirrored reference current through the eFuse in the eFuse cell, the resultant voltage drop across the eFuse in the eFuse cell determining the first voltage.

15. The method of claim 13 including the steps of:

comparing the eFuse cell voltage output with the reference voltage;

outputting a first logical value if the eFuse cell voltage output is greater than the reference voltage; and outputting a second logical value if the eFuse cell voltage output is less than the reference voltage.

16. The method of claim 15, the step of comparing the eFuse cell voltage with the reference voltage further comprising the steps of:

coupling the eFuse cell voltage output to a first input of a comparator; and coupling the reference voltage to a second input of the comparator.

17. The method of claim 16 further comprising the steps of:

coupling more than one eFuse cell voltage output to the first input of the comparator using an analog multiplexer;

providing address information to the analog multiplexer;

selecting, via the analog multiplexer, which of the more than one eFuse cell voltage outputs to pass to the first input of the comparator respondent to the address information.

* * * * *